US011715546B2

(12) United States Patent
Huang et al.

(10) Patent No.: US 11,715,546 B2
(45) Date of Patent: *Aug. 1, 2023

(54) MEMORY ARRAY TEST METHOD AND SYSTEM

(71) Applicant: TAIWAN SEMICONDUCTOR MANUFACTURING COMPANY, LTD., Hsinchu (TW)

(72) Inventors: Chien-Hao Huang, Hsinchu (TW); Katherine H. Chiang, Hsinchu (TW); Cheng-Yi Wu, Hsinchu (TW); Chung-Te Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/884,634

(22) Filed: Aug. 10, 2022

(65) Prior Publication Data

US 2022/0383974 A1 Dec. 1, 2022

Related U.S. Application Data

(63) Continuation of application No. 17/175,027, filed on Feb. 12, 2021, now Pat. No. 11,450,399.
(Continued)

(51) Int. Cl.
*G11C 29/00* (2006.01)
*G11C 29/38* (2006.01)
*G11C 11/16* (2006.01)

(52) U.S. Cl.
CPC .......... *G11C 29/38* (2013.01); *G11C 11/1673* (2013.01); *G11C 11/1675* (2013.01)

(58) Field of Classification Search
CPC . G11C 29/38; G11C 11/1697; G11C 11/1655; G11C 29/10; G11C 29/46; G11C 29/04; G11C 29/026
See application file for complete search history.

(56) References Cited

U.S. PATENT DOCUMENTS 6,744,651 B2 6/2004 Tang
7,260,442 B2 8/2007 Hwang et al.
(Continued)

FOREIGN PATENT DOCUMENTS

JP 2004234741 8/2004
KR 20170018908 2/2017
(Continued)

OTHER PUBLICATIONS

Office Action dated Dec. 17, 2021 for corresponding case No. TW 11021238060. (pp. 1-4).

*Primary Examiner* — Esaw T Abraham
(74) *Attorney, Agent, or Firm* — Hauptman Ham, LLP

(57) ABSTRACT

A method of testing a non-volatile memory (NVM) array includes obtaining a current distribution of a subset of NVM cells of the NVM array, the current distribution including first and second portions corresponding to respective logically high and low states of the subset of NVM cells, programming an entirety of the NVM cells of the NVM array to one of the logically high or low states, determining an initial bit error rate (BER) by performing first and second pass/fail (P/F) tests on each NVM cell of the NVM array, and using the current distribution to adjust the initial BER rate. Each of obtaining the current distribution, programming the entirety of the NVM cells, and performing the first and second P/F tests is performed while the NVM array is heated to a target temperature.

20 Claims, 7 Drawing Sheets

Related U.S. Application Data

(60) Provisional application No. 63/031,185, filed on May 28, 2020.

(56) References Cited

U.S. PATENT DOCUMENTS

| | | | |
|---|---|---|---|
| 8,645,776 B2* | 2/2014 | Byom | G11C 29/42 |
| | | | 714/763 |
| 8,908,445 B2 | 12/2014 | He et al. | |
| 8,954,824 B2 | 2/2015 | Bedeschi | |
| 9,224,478 B2 | 12/2015 | Eguchi et al. | |
| 9,256,709 B2 | 2/2016 | Yu et al. | |
| 9,455,038 B2* | 9/2016 | Tuers | G11C 16/3404 |
| 9,478,315 B2* | 10/2016 | Yang | G11C 29/52 |
| 9,613,715 B2* | 4/2017 | Frayer | G11C 29/08 |
| 9,672,934 B2 | 6/2017 | Liang et al. | |
| 9,870,822 B2 | 1/2018 | Ge et al. | |
| 10,216,571 B2* | 2/2019 | Franca-Neto | G06F 11/1048 |
| 10,254,982 B2 | 4/2019 | Franca-Neto et al. | |
| 10,489,086 B1 | 11/2019 | Yanes et al. | |
| 10,658,577 B2 | 5/2020 | Liu et al. | |
| 10,665,321 B2 | 5/2020 | Wang et al. | |
| 10,839,886 B2* | 11/2020 | Yuan | G11C 7/04 |
| 10,847,245 B2 | 11/2020 | Poliakov et al. | |
| 10,956,064 B2 | 3/2021 | Mehta et al. | |
| 2005/0063230 A1 | 3/2005 | Seitoh | |
| 2014/0040838 A1 | 2/2014 | Liu et al. | |
| 2015/0278429 A1 | 10/2015 | Chang | |
| 2020/0160933 A1 | 5/2020 | Sun | |

FOREIGN PATENT DOCUMENTS

| | | |
|---|---|---|
| TW | I299494 | 8/2008 |
| TW | I435326 | 4/2014 |
| WO | 2009100078 | 8/2009 |

\* cited by examiner

MEMORY ARRAY TEST METHOD AND SYSTEM

PRIORITY CLAIM

The present application is a continuation of U.S. application Ser. No. 17/175,027, filed Feb. 12, 2021, now U.S. Pat. No. 11,450,399, issued Sep. 20, 2022, which claims the priority of U.S. Provisional Application No. 63/031,185, filed May 28, 2020, each of which is incorporated herein by reference in its entirety.

BACKGROUND

In some applications, integrated circuits (ICs) include memory circuits that store data in non-volatile memory (NVM) cells in which data are not lost when the IC is powered off. Types of NVM cells include magneto-resistive random-access memory (MRAM) cells including magnetic tunnel junctions (MTJs) and resistive random-access memory (RRAM) cells including solid state layers. NVM cells such as MRAM and RRAM cells are programmable to relatively high and low resistance states that represent stored logical states. Often, to determine the logical state stored in an NVM cell, a current signal is generated having a current value based on a resistance of the NVM cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
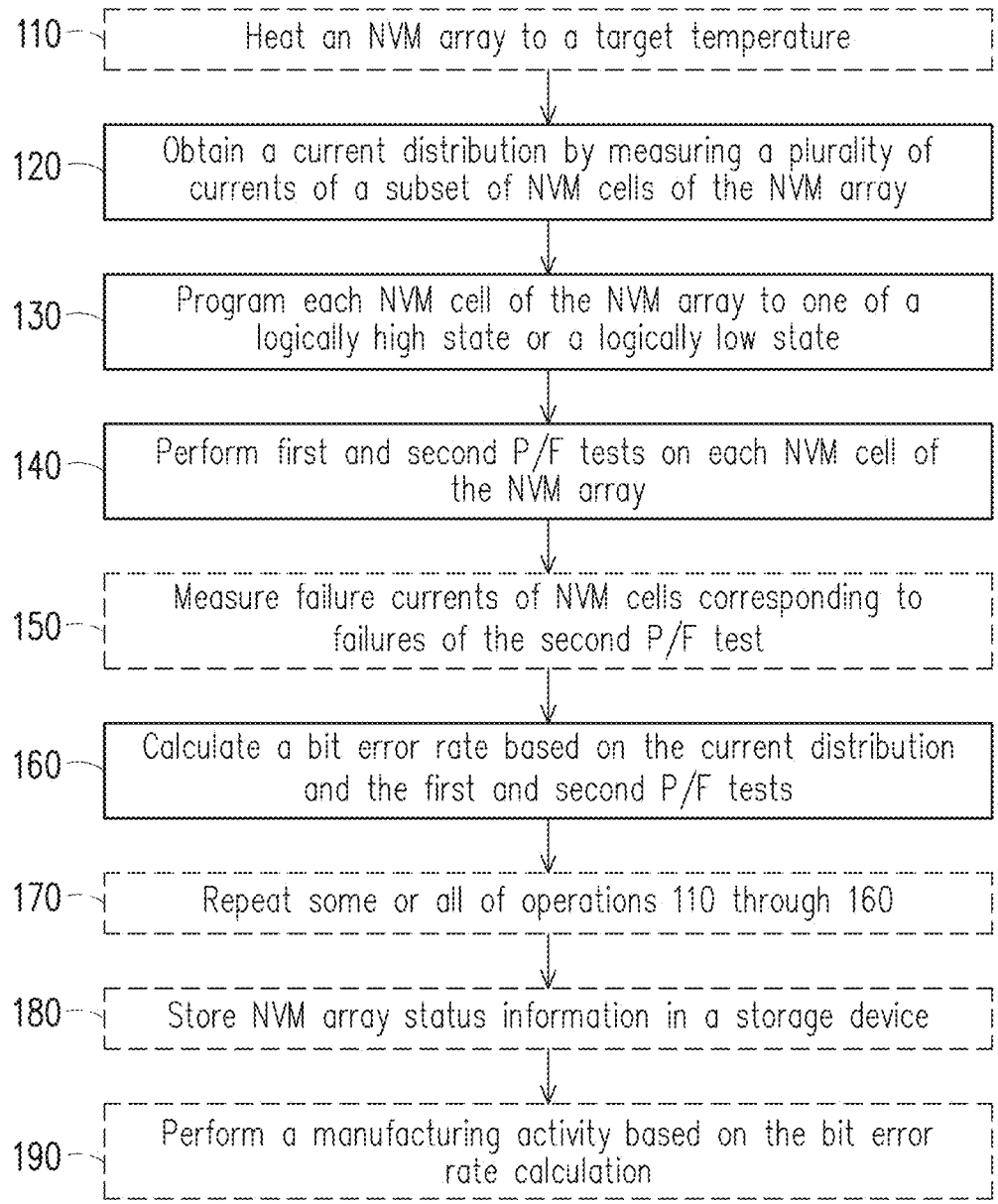
FIG. 1 is a flowchart of a method of testing an NVM array, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a method is executable on a test system and includes performing a sequence of operations while an NVM array is heated to a target temperature, whereby a current distribution obtained from a subset of the NVM cells is used to compensate for bit state determination errors. The current distribution is obtained by measuring currents of each NVM cell of the subset of NVM cells after being programmed to each of a logically high state and a logically low state. Each NVM cell of the NVM array is then programmed to one of the logically high or low states, after which first and second pass/fail (P/F) tests are performed on each NVM cell of the NVM array. In some embodiments, for each NVM cell that fails the second P/F tests, a failure current is also measured. By calculating a bit error rate based on the current distribution, the P/F tests, and failure currents if applicable, the bit failure rate is based on data obtained at the target temperature without requiring current measurements of all NVM cells of the NVM array.

In approaches in which data are obtained by programming NVM cells before ramping up to a target temperature and determining bit states after ramping down from the target temperature, bit retention errors are capable of being introduced during the heating and cooling periods. Compared to such approaches, bit error rates based on data obtained at the target temperature have improved accuracy by avoiding such errors introduced during the heating and cooling periods. Further, because NVM read windows often shrink with increasing temperatures, using the current distribution, and failure currents if applicable, to calculate the bit error rate enables compensation for misjudgments in relatively quick P/F tests at target temperatures. Test times are thereby shortened compared to approaches that include current measurements of all NVM cells of an NVM array at a target temperature, and bit error rate calculations are enabled for high target temperatures with significant degradation of NVM read windows.

FIG. 1 is a flowchart of a method 100 of testing a memory array, in accordance with some embodiments. Method 100 is usable with a memory array test system, e.g., an NVM array test system 400 discussed below with respect to FIG. 4.

The sequence in which the operations of method 100 are depicted in FIG. 1 is for illustration only; the operations of method 100 are capable of being executed simultaneously or in sequences that differ from that depicted in FIG. 1. In some embodiments, operations in addition to those depicted in FIG. 1 are performed before, between, during, and/or after the operations depicted in FIG. 1. In some embodiments, the operations of method 100 are a subset of a method of manufacturing an IC, e.g., a processor, logic, memory, or signal processing circuit, or the like.

Some or all of the operations of method 100 are capable of being performed using a semiconductor wafer including a memory array, e.g., a semiconductor wafer 300 including an MRAM array 300MA discussed below with respect to FIGS. 3A and 3B.

Some or all of the operations of method 100 are capable of being performed by a processor, e.g., a processor 502 discussed below with respect to FIG. 5. Some or all of the operations of method 100 are capable of being performed as part of a manufacturing procedure performed in an IC fabrication business, e.g., an IC fab 650 discussed below with respect to FIG. 6.

Figure 2A:
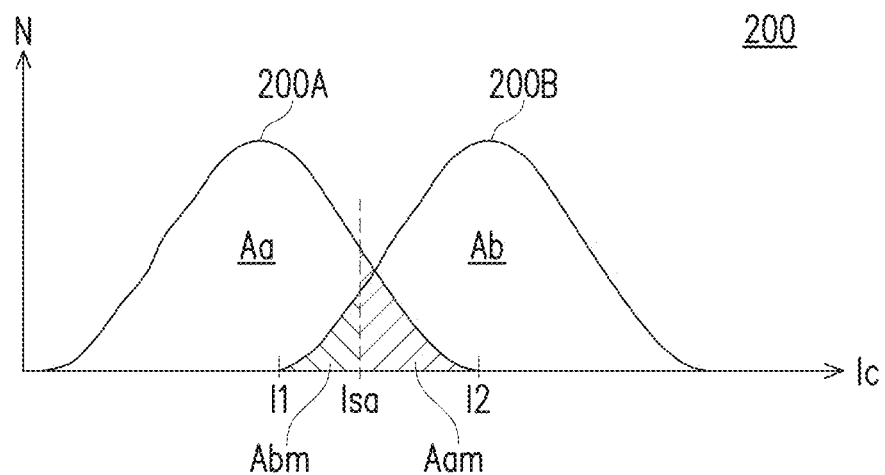
FIGS. 2A-2D are representations of NVM array test parameters, in accordance with some embodiments.
Figure 2B:
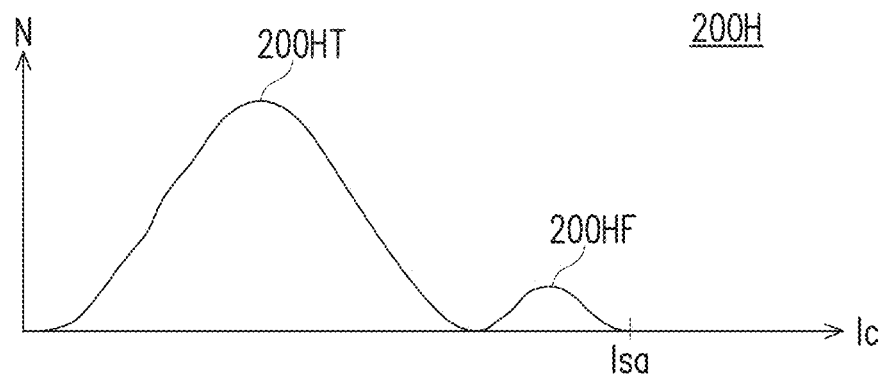
Figure 2C:
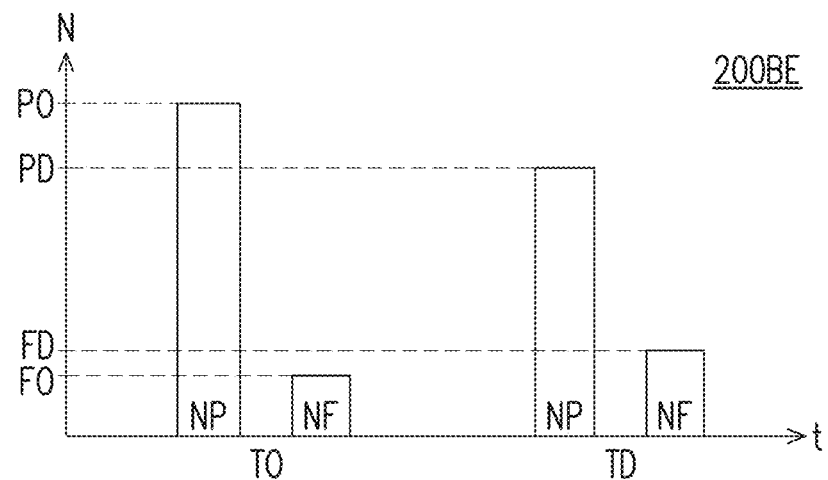
Figure 2D:
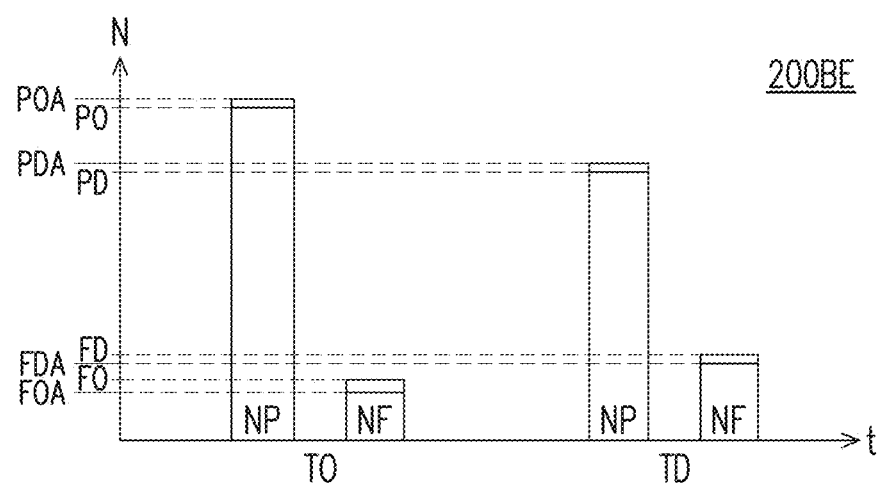

FIGS. 2A-2D are representations of NVM array test parameters, in accordance with some embodiments. FIGS. 2A-2D depict non-limiting examples corresponding to execution of some or all of method 100 in accordance with one or more embodiments. FIG. 2A depicts a non-limiting example of a current distribution 200, FIG. 2B depicts a non-limiting example of a current distribution 200H, and each of FIGS. 2C and 2D depicts a non-limiting example of a bit error distribution 200BE.

At operation 110, in some embodiments, the NVM array is heated to a target temperature, e.g., a target temperature Tg discussed below with respect to FIGS. 2A-2D and 4. The NVM array is an IC including a plurality of NVM cells, e.g., MRAM array 300MA including instances of an MRAM cell 300MC discussed below with respect to FIGS. 3A and 3B, each NVM cell being configured to be coupled to one or both of a bit line and/or sense line through one or more selection transistors responsive to one or more selection signals, e.g., a word line signal. Each NVM cell is an IC including one or more elements configured to be programmable to each of first and second resistance levels that are retained independently of a powered up or powered down state, the NVM cell thereby being considered to be non-volatile and reconfigurable. The first and second resistance levels are thereby capable of representing corresponding first and second programmable logical states. In various embodiments, the first resistance level corresponds to one of a stored logically high or low state, and the second resistance level corresponds to the other of the stored logically high or low state.

In some embodiments, the NVM array includes the NVM cells arranged as one or more banks and/or array portions, e.g., layers. In some embodiments, the NVM array includes a number of NVM cells ranging from 128 kilobits (kb) to 64 megabits (Mb). In some embodiments, the NVM array includes a number of NVM cells ranging from 1 Mb to 16 Mb. As the number of NVM cells increases, times required to access each NVM cell of the NVM array in various operations, e.g., programming and read operations, increases.

Heating the NVM array includes heating the NVM array to the target temperature above room temperature, e.g., 23 degrees Celsius (° C.). In some embodiments, heating the NVM array includes heating the NVM array to the target temperature ranging from 50° C. to 200° C. In some embodiments, heating the NVM array includes heating the NVM array to the target temperature ranging from 75° C. to 125° C. Increasing target temperatures correspond to changes in one or more NVM characteristics: acceleration of failures based on retention of programmed logical states; widening of resistance level distributions, thereby shrinking windows for measurements of resultant currents used to distinguish programmed logical states in read operations; and/or increased sensitivity to errors in distinguishing programmed logical states based on read operations used to determine retention error rates.

In various embodiments, the NVM array is included in a semiconductor wafer or an IC package, and heating the NVM array includes heating the corresponding semiconductor wafer or IC package to the target temperature. In some embodiments, the NVM array is included in the semiconductor wafer or IC package contained in a test chamber, e.g., a test chamber 430 discussed below with respect to FIG. 4, also referred to as a thermal chamber in some embodiments, and heating the NVM array includes setting the test chamber to the target temperature, e.g., target temperature Tg. In some embodiments, the NVM array is included in the semiconductor wafer positioned on a platen including a heating apparatus, also referred to as a hot chuck in some embodiments, and heating the NVM array includes setting the platen to the target temperature, e.g., target temperature Tg.

In various embodiments, heating the NVM array includes electrically connecting the NVM array to a test apparatus, e.g., a test apparatus 420 discussed below with respect to FIG. 4. In various embodiments, electrically connecting the NVM array to the test apparatus includes contacting the semiconductor wafer including the NVM array with one or more wafer probes, or inserting the IC package including the NVM array in a socket, e.g., positioned on a load board.

In some embodiments, the NVM array is an embedded NVM, e.g., an embedded MRAM (eMRAM) included in an IC, e.g., a system on a chip (SoC), and heating the NVM array includes heating the IC. In some embodiments, the NVM array is one of a plurality of NVM arrays included in the semiconductor wafer or IC package and heating the NVM array includes heating the plurality of NVM arrays.

In some embodiments, heating the NVM array includes using a test controller, e.g., a test controller 410 discussed below with respect to FIG. 4, to set the test chamber to the target temperature, e.g., target temperature Tg. In some embodiments, heating the NVM array includes using a temperature control circuit, e.g., a temperature control circuit 422 of test apparatus 420 discussed below with respect to FIG. 4.

In some embodiments, heating the NVM array includes using a processor, e.g., processor 502 discussed below with respect to FIG. 5, to set the test chamber or platen to the target temperature. In some embodiments, heating the NVM array includes executing one or more sets of instructions, e.g., a temperature control program 507 of computer program code 506 stored in a non-transitory, computer-readable storage medium 504 discussed below with respect to FIG. 5.

In some embodiments, heating the NVM array includes receiving the target temperature from a non-transitory, computer-readable storage medium or a network or user interface, e.g., receiving test criteria 522 including the target temperature from non-transitory, computer-readable storage medium 504, a network interface 512, or an I/O interface 510 and a user interface 542, each discussed below with respect to FIG. 5.

At operation 120, a current distribution is obtained by measuring a plurality of currents of a subset of NVM cells of the NVM array. Obtaining the current distribution is performed while the NVM array is heated to the target temperature, e.g., while the test chamber, e.g., test chamber 430 discussed below with respect to FIG. 4, is set to the target temperature, e.g., target temperature Tg.

In some embodiments, measuring the plurality of currents of the subset of NVM cells includes measuring the plurality of currents of a predetermined subset of NVM cells. In some embodiments, measuring the plurality of currents of the subset of NVM cells includes selecting the subset of NVM cells of the NVM array. In some embodiments, measuring the plurality of currents of the subset of NVM cells includes receiving a selection of the subset of NVM cells from a non-transitory, computer-readable storage medium or a network or user interface, e.g., receiving test criteria 522 including the selection from non-transitory, computer-readable storage medium 504, network interface 512, or I/O interface 510, each discussed below with respect to FIG. 5.

In various embodiments, measuring the plurality of currents of the subset of NVM cells includes measuring currents of a single block of NVM cells or of discontinuous individual and/or groups of NVM cells distributed throughout the NVM array.

In some embodiments, measuring the plurality of currents of the subset of NVM cells includes the subset of NVM cells having a number of NVM cells based on the number of NVM cells of the NVM array, e.g., a predefined fraction such as $1/1000$. In some embodiments, measuring the plurality of currents of the subset of NVM cells includes the subset of NVM cells having the number of NVM cells based on a previously calculated bit error rate, e.g., a predefined fraction such as $1/10$.

In some embodiments, measuring the plurality of currents of the subset of NVM cells includes the subset of NVM cells having the number of NVM cells ranging from 128 bits to 256 kb. In some embodiments, measuring the plurality of currents of the subset of NVM cells includes the subset of NVM cells having the number of NVM cells ranging from 512 bits to 128 kb. As the number of NVM cells increases, times required to access each NVM cell in the subset of NVM cells in various operations, e.g., programming and read operations, increases.

Measuring the plurality of currents of the subset of NVM cells includes programming each NVM cell of the subset of NVM cells to one of the logically high state or the logically low state, measuring a first current value of each NVM cell of the subset of NVM cells after being programmed to the one of the logically high state or the logically low state, thereby obtaining a first portion of the current distribution; and programming each NVM cell of the subset of NVM cells to the other of the logically high state or the logically low state, and measuring a second current value of each NVM cell of the subset of NVM cells after being programmed to the other of the logically high state or the logically low state, thereby obtaining a second portion of the current distribution.

Measuring the plurality of currents of the subset of NVM cells thereby includes programming each NVM cell of the subset of NVM cells to each of the logically high and logically low states and, after being programmed to each of the logically high and logically low states, measuring corresponding first and second current values of each NVM cell of the subset of NVM cells, thereby obtaining the corresponding first and second portions of the current distribution.

In some embodiments, programing an NVM cell, e.g., programming each NVM cell of the subset of NVM cells, to each of the logically high and low states includes altering a magnetic orientation of a magnetic layer of an MRAM cell, e.g., magnetic layer 300M1 discussed below with respect to FIG. 3B.

In the non-limiting example depicted in FIG. 2A, a current distribution 200 includes measured NVM cell current values Ic plotted on the x-axis and corresponding numbers of NVM cells N plotted on the y-axis. Current distribution 200 includes a portion 200A including current values Ic measured after programming each NVM cell of the subset of NVM cells to the logically high state, and a portion 200B including current values Ic measured after programming each NVM cell of the subset of NVM cells to the logically low state.

In the embodiment depicted in FIG. 2A, for the purpose of illustration, each of portions 200A and 200B is a best-fit curve based on discrete current values Ic and corresponding numbers N of NVM cells. In some embodiments, a current distribution, e.g., current distribution 200, includes portions in which the discrete values Ic and NVM cell numbers N are retained, e.g., a histogram in which current values Ic are divided into a plurality of intervals, and the NVM cell numbers N correspond to the number of NVM cells having measured current values Ic within each interval of the plurality of intervals.

A current value I1 represents a minimum current value Ic of portion 200B, and a current value I2 represents a maximum current value Ic of portion 200A. In the embodiment depicted in FIG. 2A, current value I2 is greater than current value I1 such that portions 200A and 200B overlap over a range of current values Ic from current value I1 to current value I2. In some embodiments, current value I2 is less than current value I1 such that portions 200A and 200B do not overlap.

A threshold level Isa represents a current value usable in a read operation, e.g., by an external circuit or a sense amplifier such as sense amplifier 300SA discussed below with respect to FIGS. 3A and 3B, to make a determination of a logical state of a given NVM cell, as further discussed below. In some embodiments, the logically high state corresponds to measured current values less than or equal to threshold level Isa and the logically low state corresponds to measured current values greater than threshold level Isa.

In the embodiment depicted in FIG. 2A, threshold level Isa is between current values I1 and I2 such that the overlapping region of portions 200A and 200B includes current values Ic both less than and greater than threshold level Isa. In various embodiments, threshold level Isa is less than current value I1 such that the overlapping region of portions 200A and 200B includes only current values Ic greater than threshold level Isa, or threshold level Isa is greater than current value I2 such that the overlapping region of portions 200A and 200B includes only current values Ic less than threshold level Isa.

Each of an area Aa under portion 200A and an area Ab under portion 200B corresponds to the total number of NVM cells in the subset of NVM cells. An area Aam corresponds to a fraction of the total number of NVM cells having current values Ic greater than threshold level Isa after being programmed to the logically high state, and an area Abm corresponds to a fraction of the total number of NVM cells having current values Ic less than threshold level Isa after being programmed to the logically low state.

Accordingly, after the subset of NVM cells is programmed to the logically high state, a read operation based on threshold level Isa would make an incorrect determination of a logically low state for the number Aam of NVM cells and a correct determination of the logically high state for a number of NVM cells equal to Aa−Aam. Similarly, after the subset of NVM cells is programmed to the logically low state, a read operation based on threshold level Isa would make an incorrect determination of a logically high state for the number Abm of NVM cells and a correct determination of the logically low state for a number of NVM cells equal to Ab−Abm.

Read operations on NVM cells having unknown states and based solely on comparisons of current value Ic to threshold level Isa thereby include potential errors based on the incorrect determinations. Based on current distribution 200, a percentage of incorrect determinations of NVM logical states is given by the number of incorrect determinations divided by the number of correct determinations for each of two cases.

In the first case, measured values of Ic are less than or equal to threshold level Isa, the correct determination corresponds to the logically high state, and an error rate Herr equal to the percentage of incorrect determinations that the NVM cells have the logically low state is given by $$Herr = Abm/(Aa-Aam). \quad (1)$$

Error rate Herr has a non-zero value for any non-zero value of the number Abm, and a maximum value equal to the number Abm corresponding to a zero value of the number Aam.

In the second case, measured values of Ic are greater than threshold level Isa, the correct determination corresponds to the logically low state, and an error rate Lerr equal to the percentage of incorrect determinations that the NVM cells have the logically high state is given by $$Lerr = Aam/(Ab-Abm). \quad (2)$$

Error rate Lerr has a non-zero value for any non-zero value of the number Aam, and a maximum value equal to the number Aam corresponding to a zero value of the number Abm.

FIG. 2B depicts a non-limiting example of a distribution 200H corresponding to the first case in which measured values Ic are less than or equal to threshold level Isa. A first portion 200HT and a second portion 200HF of distribution 200H correspond to NVM cells for which the logically high state is correctly and incorrectly determined, respectively, based on measured values Ic being less than or equal to threshold level Isa, The embodiment depicted in FIG. 2B is simplified for the purpose of illustration. In some embodiments, first portion 200HT and second portion 200HF overlap and/or have relative sizes and shapes other than those depicted in FIG. 2B.

In the non-limiting example depicted in FIG. 2B, error rate Herr based on current distribution 200 corresponds to the area under portion 200HF relative to the area under portion 200HT. A number of NVM cells NHmeas corresponding to distribution 200H is capable of being modified based on Herr to provide an adjusted number of NVM cells NHadj corresponding to portion 200HT, given by $$NHadj = NHmeas(1-Herr). \quad (3)$$

In this non-limiting example, for any non-zero value of error rate Herr, the number of NVM cells NHmeas determined to have the logically high state based on threshold level Isa is thereby reduced by error rate Herr to provide the adjusted number of NVM cells NHadj corresponding to NVM cells correctly determined to have the logically high state.

As illustrated by the non-limiting example depicted in FIG. 2B and further discussed below with respect to operation 160, each of error rates Herr and Lerr based on threshold level Isa and current distribution 200 is thereby usable in bit error rate calculations.

In various embodiments, threshold level Isa has a predetermined value or a value calculated based on the measured current values. In some embodiments, the predetermined value is received from a non-transitory, computer-readable storage medium or a network or user interface, e.g., included in test criteria 522 received from non-transitory, computer-readable storage medium 504, network interface 512, or I/O interface 510 and user interface 542, each discussed below with respect to FIG. 5.

In some embodiments, calculating threshold level Isa includes defining a current value corresponding to threshold level Isa such that one or a combination, e.g., an average, of a proportion of current values Ic of portion 200A less than or equal to threshold level Isa and/or a proportion of current values Ic of portion 200B greater than threshold level Isa are maximized.

In some embodiments, measuring the plurality of currents of the subset of NVM cells includes using a test apparatus, e.g., test apparatus 420, including a read/write (R/W) circuit 424 in some embodiments, discussed below with respect to FIG. 4. In some embodiments, measuring the plurality of currents of the subset of NVM cells includes using a test controller, e.g., test controller 410 discussed below with respect to FIG. 4, to execute a corresponding plurality of current measurements.

In some embodiments, measuring the plurality of currents of the subset of NVM cells includes using a processor, e.g., a processor 502 discussed below with respect to FIG. 5, to execute a corresponding plurality of current measurements. In some embodiments, measuring the plurality of currents of the subset of NVM cells includes executing one or more sets of instructions, e.g., an NVM array control program 509 of computer program code 506 stored in non-transitory, computer-readable storage medium 504 discussed below with respect to FIG. 5.

Figure 5:
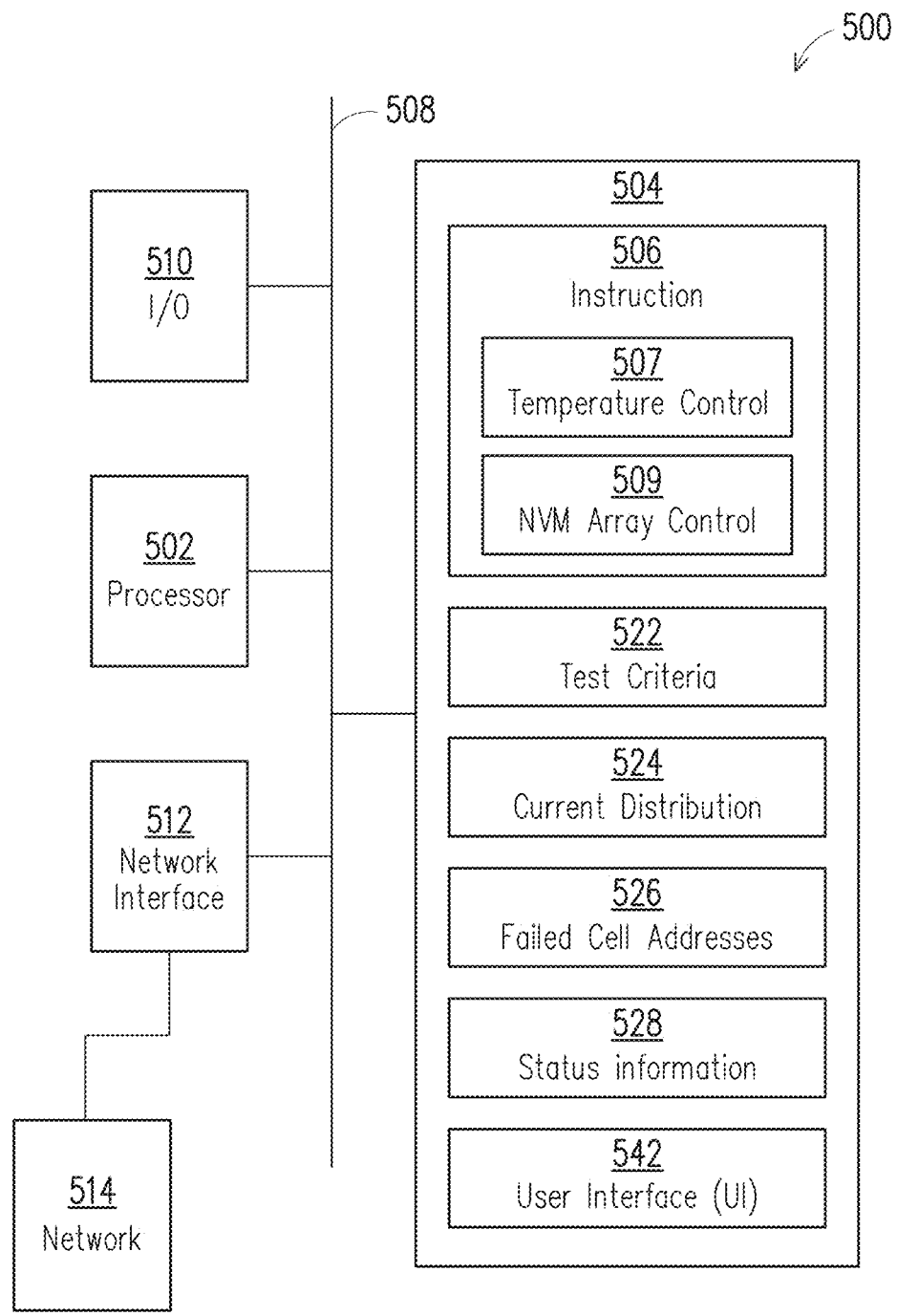
FIG. 5 is a block diagram of a test system controller, in accordance with some embodiments.

In some embodiments, obtaining the current distribution by measuring the plurality of currents of the subset of NVM cells includes outputting and/or storing one or both of the current distribution or threshold level Isa in a non-transitory, computer-readable storage medium or a network or user interface, e.g., outputting and/or storing current distribution 524 and/or test criteria 522 including threshold level Isa in non-transitory, computer-readable storage medium 504, network interface 512, or I/O interface 510, each discussed below with respect to FIG. 5.

At operation 130, each NVM cell of the NVM array is programmed to one of the logically high state or the logically low state. Programming each NVM cell of the NVM array is performed while the NVM array is heated to the target temperature, e.g., while the test chamber, e.g., test chamber 430 discussed below with respect to FIG. 4, is set to the target temperature e.g., target temperature Tg.

Programming each NVM cell of the NVM array is performed in the manner discussed above with respect to programming NVM cells as part of measuring the plurality of currents of the subset of NVM cells in operation 120. In some embodiments, programming each NVM cell of the NVM array includes programming each MRAM cell 300MC of MRAM array, 300MA discussed below with respect to FIGS. 3A and 3B.

At operation 140, first and second P/F tests are performed on each MRAM cell of the MRAM array. The first P/F tests are performed immediately after each NVM cell of the NVM array is programmed to the one of the logically high state or the logically low state in operation 130. In some embodiments, the term immediately corresponds to performing the first P/F tests after executing a short delay or free from executing a delay after programming the NVM cells of the NVM array such that an elapsed time interval has a value less than a predetermined value. In some embodiments, immediately performing the first P/F tests includes continuously executing computer program code, e.g., computer program code 506 discussed below with respect to FIG. 5.

In some embodiments, the elapsed time interval has a value less than 30 seconds. In some embodiments, the elapsed time interval has a value less than 5 seconds. In some the elapsed time interval has a value less than 1 second.

In some embodiments, performing the first P/F tests includes using a sense amplifier of the NVM array to make a first logical state determination on each NVM cell of the NVM array based on a first NVM cell current value and a threshold level, e.g., threshold level Isa discussed above with respect to operation 120. A delay is executed after performing the first P/F tests; in some embodiments, the delay is a predetermined delay. After executing the delay, the second P/F tests are performed by using the sense amplifier to make a second logical state determination on each NVM cell of the NVM array based on a second NVM cell current value and the threshold level. In some embodiments, performing the first and second P/F tests includes using a circuit external to the NVM array, e.g., a decision circuit 426 discussed below with respect to FIG. 4.

Figure 4:
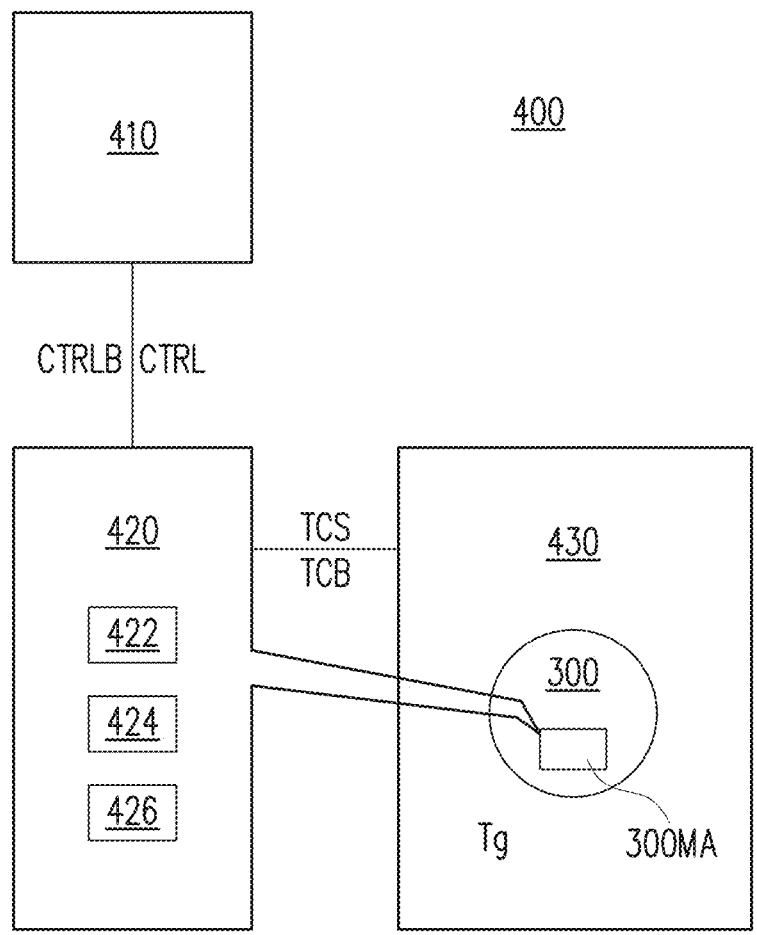
FIG. 4 is a diagram of an NVM array test system, in accordance with some embodiments.

Each of the first P/F tests, the delay execution, and the second P/F tests is performed while the NVM array is heated to the target temperature, e.g., while the test chamber, e.g., test chamber 430 discussed below with respect to FIG. 4, is set to the target temperature, e.g., target temperature Tg.

The threshold level defines a first set of current values less than or equal to the threshold level corresponding to one of the logically high or low states, and a second set of current values greater than the threshold level corresponding to the other of the logically high or low states. Determining the logical state of an NVM cell includes using the sense amplifier or external circuit to measure the current value of the corresponding NVM cell, compare the measured value to the threshold level, and output a data signal, e.g., a logic bit, indicative of the measured current value corresponding to the first or second set of current values.

An NVM cell is considered to pass a P/F test of the first and second P/F tests when the logically high or low state indicated by the data signal output by the sense amplifier or external circuit matches a previously programmed logically high or low state, e.g., at operation 130. The NVM cell is considered to fail the P/F test when the logically high or low state indicated by the data signal output by the sense amplifier or external circuit does not match the previously programmed logically high or low state.

In various embodiments, the threshold level is a predetermined threshold level, e.g., a current value programmed or hard-coded in the NVM array, or a variable threshold level, e.g., a current value determined by the NVM array or received by the NVM array from an external circuit. In some embodiments, the threshold level is received from a test apparatus, e.g. test apparatus 420, including decision circuit 426, discussed below with respect to FIG. 4. In some embodiments, the threshold level is threshold level Isa discussed above with respect to operation 120.

FIG. 2C depicts a non-limiting example of bit error distribution 200BE corresponding to passing and failing NVM cells based on programming each NVM cell of the NVM array to the logically high or low state in operation 130 and performing the first and second P/F tests in operation 140. FIG. 2C illustrates bit error distribution 200BE based on time along the x-axis and numbers of NVM cells N along the y-axis. A number of passing cells NP and a number of failing cells NF is plotted at each of a time T0 corresponding to the first P/F tests and a time TD corresponding to the second P/F tests.

At time T0, number of passing cells NP has a value P0 and number of failing cells NF has a value F0. At time TD, number of passing cells NP has a value PD and number of failing cells NF has a value FD. As depicted in FIG. 2C, value PD is less than value P0, reflecting a decrease in number of passing cells NP over time, and value FD is greater than value F0, reflecting an increase in number of failing cells NF over time.

Values P0, PD, F0, and FD are based on first and second P/F tests in which determinations of cell states are made using threshold level Isa such that each of values P0, PD, F0, and FD potentially includes numbers of cells incorrectly determined to have the logically high or low state as discussed above with respect to operation 120. Thus, each of values P0, PD, F0, and FD is capable of being adjusted to compensate for such incorrect determinations, as discussed below with respect to operation 160 and FIG. 2D.

Performing the first and second P/F tests on each NVM cell of the NVM array includes storing addresses of NVM cells that fail at least one of the first or second P/F tests. Storing the addresses of the NVM cells includes storing the address of each NVM cell that fails the first P/F test. In some embodiments, storing the addresses of the NVM cells also includes storing the address of each NVM cell that fails the second P/F test. In various embodiments, storing the addresses includes outputting and/or storing the addresses on a non-transitory, computer-readable storage medium or a network or user interface, e.g., outputting and/or storing failed cell addresses 526 in non-transitory, computer-readable storage medium 504, network interface 512, or I/O interface 510, each discussed below with respect to FIG. 5.

In various embodiments, executing the delay includes executing a predetermined delay or executing a delay derived from one or more test criteria, e.g., the target temperature. In some embodiments, executing the delay includes executing the delay received from a non-transitory, computer-readable storage medium or a network or user interface, e.g., receiving test criteria 522 including the delay from non-transitory, computer-readable storage medium 504, network interface 512, or I/O interface 510, each discussed below with respect to FIG. 5.

In some embodiments, executing the delay includes executing the delay having a value ranging from 1 minute to 60 minutes. In some embodiments, executing the delay includes executing the delay having a value ranging from 5 minutes to 15 minutes. Increasing delays at a given target temperature correspond to increasing numbers of failures based on retention of programmed logical states and to increasing overall test times.

In some embodiments, performing the first and second P/F tests on each NVM cell of the NVM array includes using a test apparatus, e.g., test apparatus 420, including decision circuit 426 in some embodiments, discussed below with respect to FIG. 4. In some embodiments, performing the first and second P/F tests on each NVM cell of the NVM array includes using a test controller, e.g., test controller 410 discussed below with respect to FIG. 4.

In some embodiments, performing the first and second P/F tests on each NVM cell of the NVM array includes using a processor, e.g., a processor 502 discussed below with respect to FIG. 5. In some embodiments, measuring the plurality of currents of the subset of NVM cells includes executing one or more sets of instructions, e.g., NVM array control program 509 of computer program code 506 stored in non-transitory, computer-readable storage medium 504 discussed below with respect to FIG. 5.

At operation 150, in some embodiments, failure currents of NVM cells corresponding to failures of the second P/F test are measured. Measuring the failure currents of the NVM cells corresponding to failures of the second P/F test is performed while the NVM array is heated to the target temperature, e.g., while the test chamber, e.g., test chamber 430 discussed below with respect to FIG. 4, is set to the target temperature, e.g., target temperature Tg.

Measuring the failure currents of the NVM cells corresponding to failures of the second P/F test is performed in the manner discussed above with respect to measuring the plurality of currents of the subset of NVM cells in operation 120.

In some embodiments, measuring the failure currents of the NVM cells corresponding to failures of the second P/F test includes using stored address information corresponding to the NVM cells that failed the second P/F test, e.g., address information stored in MRAM array 300MA discussed below with respect to FIGS. 3A and 3B or test apparatus 420 discussed below with respect to FIG. 4, or failed cell addresses 526 stored in non-transitory, computer-readable storage medium 504 discussed below with respect to FIG. 5.

In some embodiments, measuring the failure currents of the NVM cells corresponding to failures of the second P/F test includes outputting and/or storing the measured failure currents in a non-transitory, computer-readable storage medium or a network or user interface, e.g., outputting and/or storing one of test criteria 522, current distribution 524, or failed cell addresses 526 including the failure currents in non-transitory, computer-readable storage medium 504, network interface 512, or I/O interface 510, each discussed below with respect to FIG. 5.

At operation 160, a bit error rate based on the current distribution and the first and second P/F tests is calculated. In some embodiments, calculating the bit error rate is performed while the NVM array is heated to the target temperature, e.g., while the test chamber, e.g., test chamber 430 discussed below with respect to FIG. 4, is set to the target temperature, e.g., target temperature Tg. In some embodiments, calculating the bit error rate is performed while and/or after the NVM array is cooled from the target temperature or set to a new target temperature, e.g., while the test chamber, e.g., test chamber 430 discussed below with respect to FIG. 4, is set to room temperature or a temperature other than the target temperature.

Calculating the bit error rate, referred to as a retention error rate in some embodiments, includes calculating a ratio of a number of bit errors corresponding to NVM cells that fail one or both of the first or second P/F tests to the total number of NVM cells in the NVM array. In various embodiments, the ratio is based on the number of NVM cells that fail the first P/F tests, the number of NVM cells that fail the second P/F tests, or a difference between the numbers of cells that fail the first and second P/F tests.

In some embodiments, calculating the bit error rate includes, for each NVM cell that fails the second P/F test, obtaining the corresponding result of the first P/F test, e.g., by comparing the address of the NVM cell to the stored addresses of the NVM cells that previously failed the first P/F tests. The second P/F test result is compared to the first P/F test result, and an NVM cell that passes the first P/F test and fails the second P/F test is determined to fail a bit retention test.

In some embodiments, calculating the bit error rate includes calculating an initial bit error rate Ri, otherwise referred to as an initial bit retention error rate Ri, as the ratio based on the number of NVM cells determined to have failed the bit retention test relative to the total number of NVM cells in the NVM array. Initial bit error rate Ri is adjusted based on the current distribution, e.g., based on error rate Herr or Lerr calculated from current distribution 200 discussed above with respect to FIGS. 2A and 2B.

In some embodiments, each NVM cell of the NVM array is programmed to the logically low state in operation 130, and initial bit error rate Ri corresponds to NVM cells determined to have flipped to the logically high state by failing the first and/or second P/F tests based on current values greater than threshold level Isa. As discussed above with respect to FIG. 2B, the number of NVM cells determined to have the logically high state based on threshold level Isa is reduced by error rate Herr based on current distribution 200. Initial bit error rate Ri based on the number of NVM cells determined to have the logically high state is thereby similarly adjusted to calculate a bit error rate $$BER=Ri*(1-Herr) \qquad (4)$$

In some embodiments, each NVM cell of the NVM array is programmed to the logically high state in operation 130, and initial bit error rate Ri corresponds to NVM cells determined to have flipped to the logically low state by failing the first and/or second P/F tests based on current values less than or equal to threshold level Isa. In this case, initial bit error rate Ri based on the number of NVM cells determined to have the logically low state is similarly adjusted based on error rate Lerr to calculate a bit error rate $$BER=Ri*(1-Lerr) \qquad (5)$$

FIG. 2D depicts a non-limiting example of bit error distribution 200BE, discussed above with respect to operation 140 and FIG. 2C, including numbers of NVM cells adjusted by error rate Herr or Lerr corresponding to the particular embodiment.

At time T0, applying error rate Herr or Lerr causes number of failing cells NF to have an adjusted value F0A reduced from value F0, thereby causing number of passing cells NP to have an adjusted value P0A increased from value P0.

At time TD, applying error rate Herr or Lerr causes number of failing cells NF to have an adjusted value FDA reduced from value FD, thereby causing number of passing cells NP to have an adjusted value PDA increased from value PD.

In various embodiments, the ratio of the number of bit errors corresponding to NVM cells that fail one or both of the first or second P/F tests to the total number of NVM cells in the NVM array is reduced as illustrated in FIG. 2D such that the bit error rate is adjusted to compensate for state determination errors in the P/F tests as discussed above.

The bit error rate calculations discussed above are non-limiting examples provided for the purpose of illustration. In various embodiments, calculating the bit error rate includes otherwise calculating the bit error rate based on the current distribution and the first and second P/F tests.

In some embodiments, calculating the bit error rate includes using a processor, e.g., processor 502 discussed below with respect to FIG. 5.

At operation 170, in some embodiments, some or all of operations 110 through 160 are repeated. In some embodiments, the target temperature is one target temperature of a plurality of target temperatures, e.g., included in test criteria 522 stored in non-transitory, computer-readable storage medium 504 discussed below with respect to FIG. 5, and repeating some or all of operations 110 through 160 includes repeating operation 110, thereby heating the NVM array to each target temperature of the plurality of target temperatures.

In some embodiments, repeating some or all of operations 110 through 160 includes repeating operation 120, thereby obtaining one or more other current distributions by measuring currents at each target temperature of the plurality of target temperatures and/or by measuring currents of one or more other subsets of NVM cells of the NVM array, e.g., a second subset having a greater number of NVM cells than a first subset based on a calculated bit error rate exceeding a limit.

In some embodiments, repeating some or all of operations 110 through 160 includes repeating operations 130 through 160, thereby calculating a first bit error rate based on each NVM cell of the NVM array being programmed to one of the high or low logical states and a second bit error rate based on each NVM cell of the NVM array being programmed to the other of the high or low logical states.

In some embodiments, repeating some or all of operations 110 through 160 is part of a characterization process, e.g., a reliability study, of a manufacturing process, e.g., a manufacturing flow discussed below with respect to FIG. 6.

At operation 180, in some embodiments, NVM array status information is stored in a storage device. NVM array status information is information based on execution of some or all of operations 110 through 170 whereby at least one bit error rate is calculated.

In various embodiments, NVM array status information includes one or more of the at least one calculated bit error rate, NVM cell P/F status indicators, one or more NVM array P/F status or qualification indicators, NVM array error correction information, or a wafer P/F status or qualification indicator.

In various embodiments, storing the NVM array status information in the storage device includes outputting and/or storing the measured failure currents in a non-transitory, computer-readable storage medium or a network or user interface, e.g., outputting and/or storing status information 528 in non-transitory, computer-readable storage medium 504, network interface 512, or I/O interface 510, each discussed below with respect to FIG. 5.

At operation 190, in some embodiments, a manufacturing activity based on the bit error rate calculation is performed. In some embodiments, performing the manufacturing activity includes, based on the calculated bit error rate being less than or equal to a failure limit, accepting the wafer and/or NVM array such that a manufacturing flow is continued, e.g., by performing one or more wafer cutting and packaging operations. In some embodiments, performing the manufacturing activity includes, based on the calculated bit error rate being greater than the failure limit, rejecting the wafer and/or NVM array such that the manufacturing flow is altered or discontinued, e.g., by diverting the wafer or NVM from the manufacturing flow and performing a failure analysis.

In some embodiments, performing the manufacturing activity includes performing an NVM array error correction operation, e.g., reconfiguring an NVM array, based on the bit error rate calculation, e.g., based on failed cell addresses 526 discussed above and below with respect to FIG. 5.

In some embodiments, performing the manufacturing activity includes adjusting one or more manufacturing flow criteria based on the bit error rate calculation, e.g., adjusting one or more criteria applicable to the manufacturing flow discussed below with respect to FIG. 6 based on feedback from the bit error rate calculation, e.g., current distribution 524, failed cell addresses 526, and/or status information 528 discussed above and below with respect to FIG. 5.

By executing some or all of the operations of method 100, a bit error rate is calculated based on the current distribution and the first and second P/F tests, such that the bit failure rate is based on data obtained at the target temperature without requiring current measurements of all NVM cells of the NVM array.

Compared to approaches in which data are obtained before and after ramping to a target temperature, bit error rates based on data obtained by executing the relevant operations of method 100 at the target temperature have improved accuracy by avoiding errors introduced during heating and cooling periods. Further, because NVM read windows often shrink with increasing temperatures, using the current distribution to calculate the bit error rate enables compensation for misjudgments in relatively quick P/F tests at target temperatures. Test times are thereby shortened compared to approaches that include current measurements of all NVM cells of an NVM array at a target temperature, and bit error rate calculations are enabled for high target temperatures with significant degradation of NVM read windows.

Figure 3A:
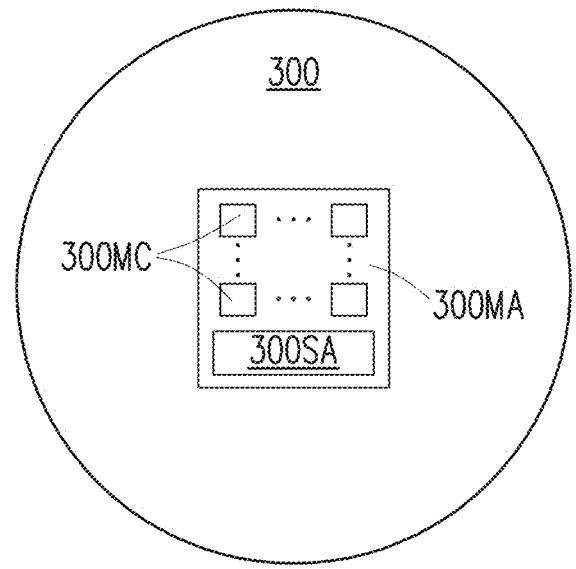
FIGS. 3A and 3B are diagrams of a semiconductor wafer including an NVM cell, in accordance with some embodiments.
Figure 3B:
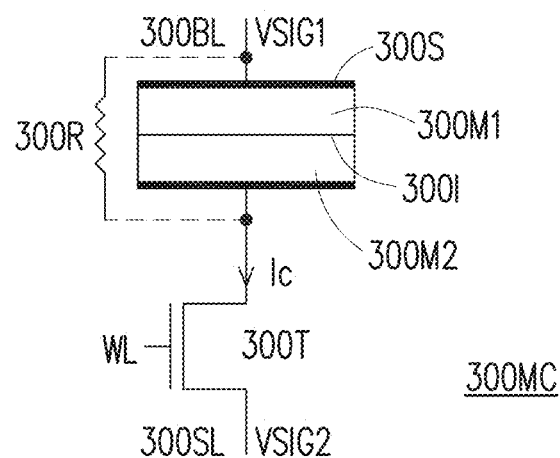

FIGS. 3A and 3B are diagrams of semiconductor wafer 300 including at least one instance of memory array 300MA including instances of memory cell 300MC, in accordance with some embodiments. Semiconductor wafer 300 is usable in method 100 as part of calculating one or more NVM array bit error rates based on the at least one instance of MRAM array 300MA including instances of MRAM cell 300MC, as discussed above with respect to FIGS. 1-2D.

FIG. 3A is a diagram of semiconductor wafer 300 including at least one instance of MRAM array 300MA, a single instance depicted in FIG. 3A. FIG. 3A is simplified for the purpose of illustration. In various embodiments, semiconductor wafer 300 includes one or more circuits (not shown) in addition to and/or including the at least one instance of MRAM array, e.g., one or more processor, logic, and/or SoC circuits, or the like. In various embodiments, the elements of semiconductor wafer 300 have relative sizes, shapes, and/or locations other than those depicted in FIG. 3A.

Each instance of MRAM array 300MA is a memory circuit including a plurality of instances of MRAM cell 300MC and at least one instance of sense amplifier 300SA. In addition to the elements depicted in FIG. 3A, each instance of MRAM array 300MA includes circuits, e.g., an input/output (I/O) circuit, and electrical connection structures, e.g., bit lines, sense lines, word lines, and/or probe pads, configured such that the MRAM array 300MA is capable of being used to perform some or all of method 100.

Sense amplifier 300SA is an electronic circuit configured to, in operation, accept a current from one or more selected MRAM cells 300MC, and based on a comparison to a threshold level, e.g., threshold level Isa discussed above with respect to FIGS. 1-2D, output a data signal, e.g., a logic bit, indicative of a result of the comparison. In some embodiments, sense amplifier 300SA is configured to output one or more data signals indicative of a measured current value of each accepted MRAM cell current.

FIG. 3B is a schematic diagram of MRAM cell 300MC, also referred to as an MRAM device 300MC in some embodiments, and is simplified for the purpose of illustration. In various embodiments, in addition to the elements depicted in FIG. 3B, MRAM cell 300MC includes one or elements in addition to those depicted in FIG. 3B.

MRAM cell 300MC includes an MTJ structure 300S and a transistor 300T. MTJ structure 300S includes a first terminal coupled to a local bit line 300BL and a second terminal coupled to a first source/drain (S/D) terminal of transistor 300T, and transistor 300T includes a second S/D terminal coupled to a local source line 300SL. A gate of transistor 300T is configured to receive a voltage signal WL, local bit line 300BL is configured to receive a voltage signal VSIG1, and local source line 300SL is configured to receive a voltage signal VSIG2.

In the embodiment depicted in FIG. 3B, transistor 300T is an n-type transistor coupled between MTJ structure 300S and local source line 300SL. In various embodiments, transistor 300T is a p-type transistor and/or is coupled between MTJ structure 300S and local bit line 300BL.

Magnetic layers 300M1 and 300M2 are positioned between the two terminals of MTJ structure 300S and are separated by an insulation layer 300I. Magnetic layer 300M2 has a pinned magnetic orientation and magnetic layer 300M1 has a magnetic orientation configurable to be either aligned with or opposite that of magnetic layer 300M2. Insulation layer 300I is configured to conduct a tunneling current such that a resistance 300R of MTJ 300S has the first resistance level corresponding to magnetic layers 300M1 and 300M2 having aligned orientations and the second resistance level corresponding to magnetic layers 300M1 and 300M2 having opposite orientations, the second resistance level being greater than the first resistance level.

In a first programming operation, voltage signals WL, VSIG1, and VSIG2 are configured to cause current Ic, discussed above with respect to FIGS. 1-2D, to have a first polarity and magnitude sufficiently large to cause the magnetic orientation of magnetic layer 300M1 to align with that of magnetic layer 300M2 such that MRAM cell 300MC is programmed to a first logical state corresponding to the first resistance level of resistance 300R.

In a second programming operation, voltage signals WL, VSIG1, and VSIG2 are configured to cause current Ic to have a second polarity and magnitude sufficiently large to cause the magnetic orientation of magnetic layer 300M1 to be opposite that of magnetic layer 300M2 such that MRAM cell 300MC is programmed to a second logical state corresponding to the second resistance level of resistance 300R.

In a read operation, voltage signals WL, VSIG1, and VSIG2 are configured to cause current Ic to have a magnitude sufficiently small to avoid altering an orientation of magnetic layer 300M1 and sufficiently large to be accepted by sense amplifier 300SA and compared to the threshold level. In various embodiments, current IRN has either the first or second polarity in the read operation.

Semiconductor wafer 300 including at least one instance of MRAM array 300MA including instances of MRAM cell 300MC is thereby configured such that an NVM array bit error rate is capable of being calculated in accordance with method 100 so as to realize some or all of the benefits discussed above with respect to method 100.

FIG. 4 is a diagram of NVM array test system 400, in accordance with some embodiments. NVM array test system 400 is usable in method 100 as part of calculating one or more bit error rates as discussed above with respect to FIGS. 1-2D.

NVM array test system 400 includes controller 410 electrically coupled to test apparatus 420 through a control signal bus CTRLB, and test apparatus 420 electrically coupled to test chamber 430 through a temperature control bus TCB.

Two or more elements are considered to be electrically coupled based on one or more direct electrical connections or conductive paths that include one or more additional circuit elements, e.g., one or more switching devices or logic or transmission gates, and are thereby capable of being controlled, e.g., made resistive or open by a transistor or other switching device.

Controller 410 is a computing device configured to generate one or more control signals CRTL on control signal bus CTRLB in accordance with performing one or more operations of method 100 discussed above with respect to FIG. 1. In some embodiments, controller 410 is test system controller 500 discussed below with respect to FIG. 5.

Test apparatus 420 is one or more electrical and/or electro-mechanical assemblies configured to receive control signals CTRL on control signal bus CTRLB, and responsive to control signals CTRL, perform the one or more operations of method 100 as discussed below, e.g., by generating one or more temperature control signals TCS on temperature control bus TCB.

Test chamber 430 is an electro-mechanical assembly including an enclosure (not shown) configured to contain a semiconductor wafer, e.g., semiconductor wafer 300 including at least one instance of MRAM array 300MA discussed above with respect to FIGS. 3A and 3B, and responsive to the one or more temperature control signals TCS, control an ambient temperature of the enclosure, e.g., maintain the ambient temperature at or near target temperature Tg.

In the embodiment depicted in FIG. 4, a portion (not labeled) of test apparatus 420 extends into test chamber 430 and contacts MRAM array 300MA, e.g., through one or more probe pins, test apparatus 420 and test chamber 430 thereby being configured to electrically connect test apparatus 420 to an NVM array such as MRAM array 300MA. In various embodiments, test apparatus 420 and test chamber 430 are otherwise configured, e.g., by test chamber 430 including a portion that contacts the NVM array, so as to electrically connect test apparatus 420 to the NVM array.

In some embodiments, test apparatus 420 and test chamber 430 are configured to electrically connect test apparatus 420 to multiple instances of NVM array 300MA in parallel. In some embodiments, the NVM array is included in an IC package and test apparatus 420 and test chamber 430 are appropriately configured, e.g., by including one or more load boards (not shown), to connect test apparatus 420 to one or more instances of the NVM array, e.g., MRAM array 300MA.

In the embodiment depicted in FIG. 4, test apparatus 420 includes temperature control circuit 422, R/W circuit 424, and decision circuit 426. Each of temperature control circuit 422, R/W circuit 424, and decision circuit 426 is an electronic circuit configured to perform the functions discussed below responsive to one or more of control signals CTRL received on control signal bus CTRLB.

Temperature control circuit 422 includes hardware and/or software instructions configured to, in operation, respond to one or more of control signals CTRL by outputting temperature control signals TCS to temperature control bus TCB configured to set test chamber to one or more instances of target temperature Tg.

In some embodiments, test apparatus 420 does not include temperature control circuit 422, and NVM array test system 400 is otherwise configured to set test chamber 430 to one or more instances of target temperature Tg. In some embodiments, NVM array test system 400 does not include temperature control bus TCB, controller 410 is electrically coupled to test chamber 430 through control signal bus CTRLB, and controller 410 is configured, e.g., by including temperature control 507 discussed below with respect to FIG. 5, to output one or more of control signals CTRL configured to set test chamber 430 to one or more instances of target temperature Tg.

R/W circuit 424 includes hardware and/or software instructions configured to, in operation, respond to one or more of control signals CTRL by outputting and/or inputting one or more signals (not shown in FIG. 4), e.g., voltage signals VSIG1 and VSIG2 and currents Ic discussed above with respect to FIGS. 1-3B, to MRAM array 300MA configured to, in accordance with the various operations discussed above with respect to FIGS. 1-3B, program NVM cells, e.g., MRAM cells 300MC, to the logically high and low states and measure NVM cell current values, e.g., MRAM cell 300MC current values.

Decision circuit 426 includes hardware and/or software instructions configured to, in operation, respond to one or more of control signals CTRL by outputting and/or inputting one or more signals (not shown) to the NVM array, e.g., MRAM array 300MA, configured to, in accordance with the various operations discussed above with respect to FIGS. 1-3B, perform logical state determinations of NVM cells, e.g., MRAM cells 300MC.

By the configuration discussed above, test apparatus 420 including R/W circuit 424 and decision circuit 426 is configured to, in operation, respond to one or more of control signals CTRL by performing the various NVM array programming and measurement operations discussed above. In some embodiments, test apparatus 420 is otherwise configured, e.g., does not include one or both of R/W circuit 424 or decision circuit 426, to, in operation, respond to one or more of control signals CTRL by performing the various NVM array programming and measurement operations discussed above, e.g., by interfacing to one or more instances of sense amplifier 300SA discussed above with respect to FIGS. 3A and 3B.

NVM array test system 400 is thereby configured such that a bit error rate is capable of being calculated in accordance with method 100 so as to realize some or all of the benefits discussed above with respect to method 100.

FIG. 5 is a block diagram of test system controller 500, in accordance with some embodiments. Methods described herein of testing memory arrays in accordance with one or more embodiments are implementable, for example, using test system controller 500, in accordance with some embodiments. Test system controller 500 is usable as controller 410 discussed above with respect to FIG. 4.

In some embodiments, test system controller 500 is a general purpose computing device including hardware processor 502 and non-transitory, computer-readable storage medium 504. Non-transitory, computer-readable storage medium 504, amongst other things, is encoded with, i.e., stores, computer program code 506, i.e., a set of executable instructions. Execution of instructions 506 by hardware processor 502 represents (at least in part) a test system which implements a portion or all of a method, e.g., method 100 of testing an NVM array discussed above with respect to FIG. 1 (hereinafter, the noted processes and/or methods).

Processor 502 is electrically coupled to non-transitory, computer-readable storage medium 504 via a bus 508. Processor 502 is also electrically coupled to I/O interface 510 by bus 508. Network interface 512 is also electrically connected to processor 502 via bus 508. Network interface 512 is connected to a network 514, so that processor 502 and non-transitory, computer-readable storage medium 504 are capable of connecting to external elements via network 514.

Processor 502 is configured to execute computer program code 506 encoded in non-transitory, computer-readable storage medium 504 in order to cause test system controller 500 to be usable for performing a portion or all of the noted processes and/or methods. In one or more embodiments, processor 502 is a central processing unit (CPU), a multi-processor, a distributed processing system, an application specific integrated circuit (ASIC), and/or a suitable processing unit.

In one or more embodiments, non-transitory, computer-readable storage medium 504 is an electronic, magnetic, optical, electromagnetic, infrared, and/or a semiconductor system (or apparatus or device). For example, non-transitory, computer-readable storage medium 504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, non-transitory, computer-readable storage medium 504 includes a compact disk-read only memory (CD-ROM), a compact disk-read/write (CD-R/W), and/or a digital video disc (DVD).

In one or more embodiments, non-transitory, computer-readable storage medium 504 stores computer program code 506 configured to cause test system controller 500 to be usable for performing a portion or all of the noted processes and/or methods. In one or more embodiments, non-transitory, computer-readable storage medium 504 stores computer program code 506 including one or both of temperature control 507 or NVM array control 509 to cause test system controller 500 to be usable for performing a portion or all of the noted processes and/or methods.

In one or more embodiments, non-transitory, computer-readable storage medium 504 also stores information which facilitates performing a portion or all of the noted processes and/or methods. In one or more embodiments, non-transitory, computer-readable storage medium 504 stores one or more of test criteria 522, current distribution 524, failed cell addresses 526, or status information 528, each of which facilitates performing a portion or all of the noted processes and/or methods.

IC layout diagram generation system 500 includes I/O interface 510. I/O interface 510 is coupled to external circuitry. In one or more embodiments, I/O interface 510 includes a keyboard, keypad, mouse, trackball, trackpad, touchscreen, and/or cursor direction keys for communicating information and commands to processor 502.

IC layout diagram generation system 500 also includes network interface 512 coupled to processor 502. Network interface 512 allows system 500 to communicate with network 514, to which one or more other computer systems are connected. Network interface 512 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC layout diagram generation systems 500.

IC layout diagram generation system 500 is configured to receive information through I/O interface 510. The information received through I/O interface 510 includes one or more of instructions, data, design rules, libraries of standard cells, and/or other parameters for processing by processor 502. The information is transferred to processor 502 via bus 508. IC layout diagram generation system 500 is configured to receive information related to a UI through I/O interface 510. The information is stored in non-transitory, computer-readable storage medium 504 as user interface (UI) 542.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an NVM test system, e.g., NVM array test system 400 discussed above with respect to FIG. 4. In some embodiments, a portion or all of the noted processes and/or methods is implemented as a software application that is used by test system controller 500.

Figure 6:
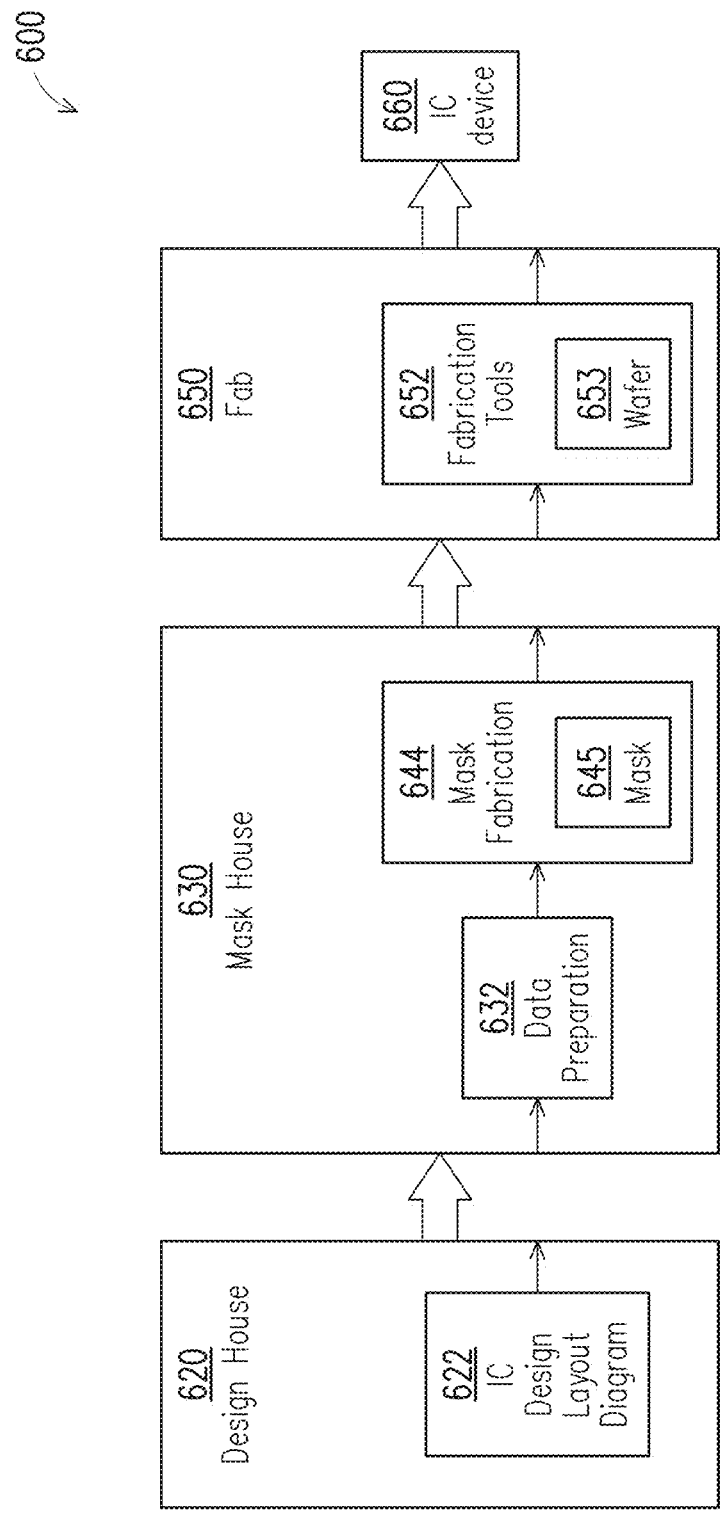
FIG. 6 is a block diagram of an IC manufacturing system, and an IC manufacturing flow associated therewith, in accordance with some embodiments.

FIG. 6 is a block diagram of IC manufacturing system 600, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 600.

In FIG. 6, IC manufacturing system 600 includes entities, such as a design house 620, a mask house 630, and an IC manufacturer/fabricator ("fab") 650, that interact with one another in the design, development, and manufacturing cycles and/or services related to manufacturing an IC device 660. The entities in system 600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 620, mask house 630, and IC fab 650 is owned by a single larger company. In some embodiments, two or more of design house 620, mask house 630, and IC fab 650 coexist in a common facility and use common resources.

Design house (or design team) 620 generates an IC design layout diagram 622. IC design layout diagram 622 includes various geometrical patterns, e.g., an IC layout diagram discussed above. The geometrical patterns correspond to patterns of metal, oxide, or semiconductor layers that make up the various components of IC device 660 to be fabricated. The various layers combine to form various IC features. For example, a portion of IC design layout diagram 622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 620 implements a proper design procedure to form IC design layout diagram 622. The design procedure includes one or more of logic design, physical design or place and route. IC design layout diagram 622 is presented in one or more data files having information of the geometrical patterns. For example, IC design layout diagram 622 can be expressed in a GDSII file format or DFII file format.

Mask house 630 includes data preparation 632 and mask fabrication 644. Mask house 630 uses IC design layout diagram 622 to manufacture one or more masks 645 to be used for fabricating the various layers of IC device 660 according to IC design layout diagram 622. Mask house 630 performs mask data preparation 632, where IC design layout diagram 622 is translated into a representative data file ("RDF"). Mask data preparation 632 provides the RDF to mask fabrication 644. Mask fabrication 644 includes a mask writer. A mask writer converts the RDF to an image on a substrate, such as a mask (reticle) 645 or a semiconductor wafer 653. The design layout diagram 622 is manipulated by mask data preparation 632 to comply with particular characteristics of the mask writer and/or requirements of IC fab 650. In FIG. 6, mask data preparation 632 and mask fabrication 644 are illustrated as separate elements. In some embodiments, mask data preparation 632 and mask fabrication 644 can be collectively referred to as mask data preparation.

In some embodiments, mask data preparation 632 includes optical proximity correction (OPC) which uses lithography enhancement techniques to compensate for image errors, such as those that can arise from diffraction, interference, other process effects and the like. OPC adjusts IC design layout diagram 622. In some embodiments, mask data preparation 632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 632 includes a mask rule checker (MRC) that checks the IC design layout diagram 622 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 622 to compensate for limitations during mask fabrication 644, which may undo part of the modifications performed by OPC in order to meet mask creation rules.

In some embodiments, mask data preparation 632 includes lithography process checking (LPC) that simulates processing that will be implemented by IC fab 650 to fabricate IC device 660. LPC simulates this processing based on IC design layout diagram 622 to create a simulated manufactured device, such as IC device 660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 622.

It should be understood that the above description of mask data preparation 632 has been simplified for the purposes of clarity. In some embodiments, data preparation 632 includes additional features such as a logic operation (LOP) to modify the IC design layout diagram 622 according to manufacturing rules. Additionally, the processes applied to IC design layout diagram 622 during data preparation 632 may be executed in a variety of different orders.

After mask data preparation 632 and during mask fabrication 644, a mask 645 or a group of masks 645 are fabricated based on the modified IC design layout diagram 622. In some embodiments, mask fabrication 644 includes performing one or more lithographic exposures based on IC design layout diagram 622. In some embodiments, an electron-beam (e-beam) or a mechanism of multiple e-beams is used to form a pattern on a mask (photomask or reticle) 645 based on the modified IC design layout diagram 622. Mask 645 can be formed in various technologies. In some embodiments, mask 645 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 645 includes a transparent substrate (e.g., fused quartz) and an opaque material (e.g., chromium) coated in the opaque regions of the binary mask. In another example, mask 645 is formed using a phase shift technology. In a phase shift mask (PSM) version of mask 645, various features in the pattern formed on the phase shift mask are configured to have proper phase difference to enhance the resolution and imaging quality. In various examples, the phase shift mask can be attenuated PSM or alternating PSM. The mask(s) generated by mask fabrication 644 is used in a variety of processes. For example, such a mask(s) is used in an ion implantation process to form various doped regions in semiconductor wafer 653, in an etching process to form various etching regions in semiconductor wafer 653, and/or in other suitable processes.

IC fab 650 is an IC fabrication business that includes one or more manufacturing facilities for the fabrication of a variety of different IC products. In some embodiments, IC Fab 650 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 650 includes wafer fabrication tools 652 configured to execute various manufacturing operations on semiconductor wafer 653 such that IC device 660 is fabricated in accordance with the mask(s), e.g., mask 645. In various embodiments, fabrication tools 652 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 650 uses mask(s) 645 fabricated by mask house 630 to fabricate IC device 660. Thus, IC fab 650 at least indirectly uses IC design layout diagram 622 to fabricate IC device 660. In some embodiments, semiconductor wafer 653 is fabricated by IC fab 650 using mask(s) 645 to form IC device 660. In some embodiments, the IC fabrication includes performing one or more lithographic exposures based at least indirectly on IC design layout diagram 622. Semiconductor wafer 653 includes a silicon substrate or other proper substrate having material layers formed thereon. Semiconductor wafer 653 further includes one or more of various doped regions, dielectric features, multilevel interconnects, and the like (formed at subsequent manufacturing steps).

Details regarding an IC manufacturing system (e.g., system 600 of FIG. 6), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a method of testing an NVM array includes obtaining a current distribution of a subset of NVM cells of the NVM array, the current distribution including first and second portions corresponding to respective logically high and low states of the subset of NVM cells, programming an entirety of the NVM cells of the NVM array to one of the logically high or low states, determining an initial BER by performing first and second P/F tests on each NVM cell of the NVM array, and using the current distribution to adjust the initial BER rate. Each of obtaining the current distribution, programming the entirety of the NVM cells, and performing the first and second P/F tests is performed while the NVM array is heated to a target temperature. In some embodiments, obtaining the current distribution of the subset of NVM cells includes selecting the subset of NVM cells having a first number being a predefined fraction of a second number of NVM cells of the NVM array. In some embodiments, the predefined fraction corresponds to the first number ranging from 512 bits to 128 kb and the second number ranging from 1 Mb to 16 Mb. In some embodiments, the predefined fraction has a value based on a previously calculated BER. In some embodiments, determining the initial BER incudes failing an NVM cell based on passing the first P/F test and failing the second P/F test. In some embodiments, using the current distribution to adjust the initial BER includes, for the one of the logically high or low states to which the entirety of the NVM cells of the NVM array is programmed, calculating a first error rate based on the corresponding first or second portion of the current distribution, and reducing the initial BER by the first error rate. In some embodiments, calculating the first error rate includes determining percentages of the first portion of the current distribution above and below a threshold current level, and/or determining percentages of the second portion of the current distribution above and below the threshold current level. In some embodiments, the method includes measuring failure currents of NVM cells corresponding to failures of the second P/F test.

In some embodiments, an NVM array test system includes a test chamber, a test apparatus, a processor, and a non-transitory, computer readable storage medium including computer program code for one or more programs. The non-transitory, computer readable storage medium and the computer program code are configured to, with the processor, cause the system to cause the test apparatus to obtain a current distribution of a subset of NVM cells of the NVM array, the current distribution including first and second portions corresponding to respective logically high and low states of the subset of NVM cells, program each NVM cell of the NVM array to one of the logically high or low states, determine an initial BER by performing first and second P/F tests on each NVM cell of the NVM array, and use the current distribution to adjust the initial BER rate. Each of causing the test apparatus to obtain the current distribution, programming each NVM cell of the NVM array, and performing the first and second P/F tests includes using the test chamber to maintain the NVM array at a target temperature. In some embodiments, the non-transitory, computer readable storage medium and the computer program code are configured to, with the processor, further cause the system to obtain the current distribution by receiving a stored selection of the subset of NVM cells corresponding to a first number of NVM cells of the subset of NVM cells being a predefined fraction of a second number of NVM cells of the NVM array. In some embodiments, the stored selection includes the predefined fraction corresponding to the first number ranging from 512 bits to 128 kb and the second number ranging from 1 Mb to 16 Mb, and/or having a value based on a previously calculated BER. In some embodiments, the non-transitory, computer readable storage medium and the computer program code are configured to, with the processor, further cause the system to use the current distribution to adjust the initial BER by, for the one of the logically high or low states to which the entirety of the NVM cells of the NVM array is programmed, calculating a first error rate based on the corresponding first or second portion of the current distribution, and reducing the initial BER by the first error rate. In some embodiments, the non-transitory, computer readable storage medium and the computer program code are configured to, with the processor, further cause the system to calculate the first error rate by determining percentages of the first portion of the current distribution above and below a threshold current level, and/or determining percentages of the second portion of the current distribution above and below the threshold current level. In some embodiments, the non-transitory, computer readable storage medium and the computer program code are configured to, with the processor, further cause the system to execute a delay between performing the first P/F test on each NVM cell of the NVM array and performing the second P/F test on each NVM cell of the NVM array.

In some embodiments, a method of testing an MRAM array includes obtaining a current distribution of a subset of MRAM cells of the MRAM array, the current distribution including first and second portions corresponding to respective high and low resistance levels of the subset of MRAM cells, programming an entirety of the MRAM cells of the MRAM array to one of the high or low resistance levels, determining an initial BER by performing first P/F tests on each MRAM cell of the MRAM array, executing a delay, and performing second P/F tests on each MRAM cell of the MRAM array, and using the current distribution to adjust the initial BER rate. Each of obtaining the current distribution, programming the entirety of the MRAM cells, performing the first and second P/F tests, and executing the delay is performed while the MRAM array is heated to a target temperature. In some embodiments, obtaining the first portion of the current distribution includes applying a voltage signal to each MRAM cell of the subset of MRAM cells in which the voltage signal is configured to cause magnetic layers of the MRAM cell to have opposite orientations, and obtaining the second portion of the current distribution includes applying the voltage signal to each MRAM cell of the subset of MRAM cells in which the voltage signal is configured to cause the magnetic layers of the MRAM cell to have aligned orientations. In some embodiments, obtaining the current distribution of the subset of MRAM cells includes the subset of MRAM cells having a first number being a predefined fraction of a second number of MRAM cells of the MRAM array. In some embodiments, the predefined fraction corresponds to the first number ranging from 512 bits to 128 kb and the second number ranging from 1 Mb to 16 Mb, and/or has a value based on a previously calculated BER. In some embodiments, using the current distribution to adjust the initial BER includes calculating a first error rate by determining percentages of the first or second portion of the current distribution above and below a threshold current level, the first or second portion corresponding to the one of the logically high or low states to which the entirety of the MRAM cells of the MRAM array is programmed, and reducing the initial BER by the first error rate. In some embodiments, executing the delay includes executing a predetermined delay having a value ranging from 5 minutes to 15 minutes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of testing a non-volatile memory (NVM) array, the method comprising:
    obtaining a current distribution of a subset of NVM cells of the NVM array, the current distribution comprising first and second portions corresponding to respective logically high and low states of the subset of NVM cells;
    programming an entirety of the NVM cells of the NVM array to one of the logically high or low states;
    determining an initial bit error rate (BER) by performing first and second pass/fail (P/F) tests on each NVM cell of the NVM array; and
    using the current distribution to adjust the initial BER rate,
    wherein each of the obtaining the current distribution, the programming the entirety of the NVM cells, and the performing the first and second P/F tests is performed while the NVM array is heated to a target temperature.

2. The method of claim 1, wherein the obtaining the current distribution of the subset of NVM cells comprises selecting the subset of NVM cells having a first number being a predefined fraction of a second number of NVM cells of the NVM array.

3. The method of claim 2, wherein the predefined fraction corresponds to the first number ranging from 512 bits to 128 kilobits (kb) and the second number ranging from 1 megabit (Mb) to 16 Mb.

4. The method of claim 2, wherein the predefined fraction has a value based on a previously calculated BER.

5. The method of claim 1, wherein the determining the initial BER comprises failing an NVM cell based on passing the first P/F test and failing the second P/F test.

6. The method of claim 1, wherein the using the current distribution to adjust the initial BER comprises:
    for the one of the logically high or low states to which the entirety of the NVM cells of the NVM array is programmed, calculating a first error rate based on the corresponding first or second portion of the current distribution; and
    reducing the initial BER by the first error rate.

7. The method of claim 6, wherein the calculating the first error rate comprises:
    determining percentages of the first portion of the current distribution above and below a threshold current level, and/or determining percentages of the second portion of the current distribution above and below the threshold current level.

8. The method of claim 1, further comprising measuring failure currents of NVM cells corresponding to failures of the second P/F test.

9. A non-volatile memory (NVM) array test system comprising:
a test chamber;
a test apparatus;
a processor; and
a non-transitory, computer readable storage medium including computer program code for one or more programs, the non-transitory, computer readable storage medium and the computer program code being configured to, with the processor, cause the system to:
cause the test apparatus to obtain a current distribution of a subset of NVM cells of the NVM array, the current distribution comprising first and second portions corresponding to respective logically high and low states of the subset of NVM cells;
program each NVM cell of the NVM array to one of the logically high or low states;
determine an initial bit error rate (BER) by performing first and second pass/fail (P/F) tests on each NVM cell of the NVM array; and
use the current distribution to adjust the initial BER rate,
wherein each of causing the test apparatus to obtain the current distribution, programming each NVM cell of the NVM array, and performing the first and second P/F tests comprises using the test chamber to maintain the NVM array at a target temperature.

10. The NVM array test system of claim 9, wherein the non-transitory, computer readable storage medium and the computer program code are configured to, with the processor, further cause the system to obtain the current distribution by:
receiving a stored selection of the subset of NVM cells corresponding to a first number of NVM cells of the subset of NVM cells being a predefined fraction of a second number of NVM cells of the NVM array.

11. The NVM array test system of claim 10, wherein the stored selection comprises the predefined fraction corresponding to the first number ranging from 512 bits to 128 kilobits (kb) and the second number ranging from 1 megabit (Mb) to 16 Mb, and/or having a value based on a previously calculated BER.

12. The NVM array test system of claim 9, wherein the non-transitory, computer readable storage medium and the computer program code are configured to, with the processor, further cause the system to use the current distribution to adjust the initial BER by:
for the one of the logically high or low states to which the entirety of the NVM cells of the NVM array is programmed, calculating a first error rate based on the corresponding first or second portion of the current distribution; and
reducing the initial BER by the first error rate.

13. The NVM array test system of claim 12, wherein the non-transitory, computer readable storage medium and the computer program code are configured to, with the processor, further cause the system to calculate the first error rate by:
determining percentages of the first portion of the current distribution above and below a threshold current level, and/or
determining percentages of the second portion of the current distribution above and below the threshold current level.

14. The NVM array test system of claim 9, wherein the non-transitory, computer readable storage medium and the computer program code are configured to, with the processor, further cause the system to execute a delay between performing the first P/F test on each NVM cell of the NVM array and performing the second P/F test on each NVM cell of the NVM array.

15. A method of testing a magneto-resistive random access memory (MRAM) array, the method comprising:
obtaining a current distribution of a subset of MRAM cells of the MRAM array, the current distribution comprising first and second portions corresponding to respective high and low resistance levels of the subset of MRAM cells;
programming an entirety of the MRAM cells of the MRAM array to one of the high or low resistance levels;
determining an initial bit error rate (BER) by
performing first pass/fail (P/F) tests on each MRAM cell of the MRAM array,
executing a delay, and
performing second P/F tests on each MRAM cell of the MRAM array; and
using the current distribution to adjust the initial BER rate,
wherein each of the obtaining the current distribution, the programming the entirety of the MRAM cells, the performing the first and second P/F tests, and the executing the delay is performed while the MRAM array is heated to a target temperature.

16. The method of claim 15, wherein
the obtaining the first portion of the current distribution comprises applying a voltage signal to each MRAM cell of the subset of MRAM cells in which the voltage signal is configured to cause magnetic layers of the MRAM cell to have opposite orientations, and
the obtaining the second portion of the current distribution comprises applying the voltage signal to each MRAM cell of the subset of MRAM cells in which the voltage signal is configured to cause the magnetic layers of the MRAM cell to have aligned orientations.

17. The method of claim 15, wherein the obtaining the current distribution of the subset of MRAM cells comprises the subset of MRAM cells having a first number being a predefined fraction of a second number of MRAM cells of the MRAM array.

18. The method of claim 17, wherein the predefined fraction
corresponds to the first number ranging from 512 bits to 128 kilobits (kb) and the second number ranging from 1 megabit (Mb) to 16 Mb, and/or
has a value based on a previously calculated BER.

19. The method of claim 15, wherein the using the current distribution to adjust the initial BER comprises:
calculating a first error rate by determining percentages of the first or second portion of the current distribution above and below a threshold current level, the first or second portion corresponding to the one of the logically high or low states to which the entirety of the MRAM cells of the MRAM array is programmed; and
reducing the initial BER by the first error rate.

20. The method of claim 15, wherein the executing the delay comprises executing a predetermined delay having a value ranging from 5 minutes to 15 minutes.

\* \* \* \* \*